United States Patent
Soga et al.

(10) Patent No.: US 6,204,490 B1
(45) Date of Patent: Mar. 20, 2001

(54) METHOD AND APPARATUS OF MANUFACTURING AN ELECTRONIC CIRCUIT BOARD

(75) Inventors: Tasao Soga, Hitachi; Toshiharu Ishida, Fujisawa; Tetsuya Nakatsuka; Hanae Shimokawa, both of Yokohama; Koji Serizawa, Fujisawa; Yasuo Amano, Yokohama; Suguru Sakaguchi, Chigasaki; Hiroshi Yamaguchi, Fujisawa, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/323,702

(22) Filed: Jun. 1, 1999

(30) Foreign Application Priority Data

Jun. 4, 1998 (JP) .................................................. 10-155594
Jun. 4, 1998 (JP) .................................................. 10-155595

(51) Int. Cl.[7] ...................................................... H05B 6/64
(52) U.S. Cl. ........................ 219/678; 148/400; 420/560; 228/208; 228/209; 205/177
(58) Field of Search ..................................... 148/525, 400, 148/24, 465, 26, 442; 219/678; 205/126, 177; 420/560, 587, 559, 561, 662; 228/262.9, 643, 668

(56) References Cited

U.S. PATENT DOCUMENTS

| 5,411,703 | * | 5/1995 | Gonya et al. | 420/561 |
|---|---|---|---|---|
| 5,429,689 | * | 7/1995 | Shangguan et al. | 148/400 |
| 5,439,639 | * | 8/1995 | Vianco et al. | 420/562 |
| 5,476,726 | * | 12/1995 | Harada et al. | 428/643 |
| 5,520,752 | * | 5/1996 | Lucey, Jr. et al. | 148/400 |
| 5,536,908 | * | 7/1996 | Etchells et al. | 174/257 |
| 5,755,896 | * | 5/1998 | Paruchuri et al. | 148/400 |
| 5,759,379 | * | 6/1998 | Cavallotti et al. | 205/177 |
| 5,783,059 | * | 7/1998 | Cavallotti et al. | 205/226 |
| 5,817,190 | * | 10/1998 | Takezawa et al. | 148/23 |
| 5,863,406 | * | 1/1999 | Mazzoni et al. | 205/126 |
| 5,928,404 | * | 7/1999 | Paruchuri et al. | 75/255 |
| 6,045,604 | * | 4/2000 | Cavallotti et al. | 106/1.22 |
| 6,077,477 | * | 6/2000 | Sakai et al. | 420/560 |
| 6,086,683 | * | 7/2000 | Toki et al. | 148/24 |

FOREIGN PATENT DOCUMENTS 8-164495   6/1996   (JP) .

OTHER PUBLICATIONS

"Lift–off problem can be solved by a lead–free solder as an alternative material", Nikkan Kogyo Shinbun (newspaper article).

Collection of Lectures and Papers on Circuit Mounting at Grand Scientific Lecture Meeting, Mar. 24, 1998, p. 67.

Nikkan Kogyo Shinbun, article issued Apr. 27, 1998, "Elimination of Exfoliation of Substance Material".

* cited by examiner

Primary Examiner—Teresa Walberg
Assistant Examiner—Jeffrey Pwu
(74) Attorney, Agent, or Firm—Mattingly, Stanger & Malur, P.C.

(57) ABSTRACT

Electronic components are bonded to an electronic circuit board with a lead-free solder. The bonded structure is cooled from a temperature close to the liquids temperature of the solder to a temperature close to the solids temperature of the solder at a first cooling rate of about 10 to 20° C./second, followed by cooling the bonded structure to a temperature lower than the solids temperature of the solder at a second cooling rate of about 0.1 to less than 5° C./second.

21 Claims, 16 Drawing Sheets

SECTIONAL VIEW OF A JOINT AT THROUGH HOLE POINT (Sn-2.8Ag-15Bi)

OUTSIDE VIEW OF THE JOINT SHOWN IN FIG. 2
(Sn-2.8Ag-15Bi)

FROM 205 °C PUT INTO NORMAL WATER AND KEPT THEREIN

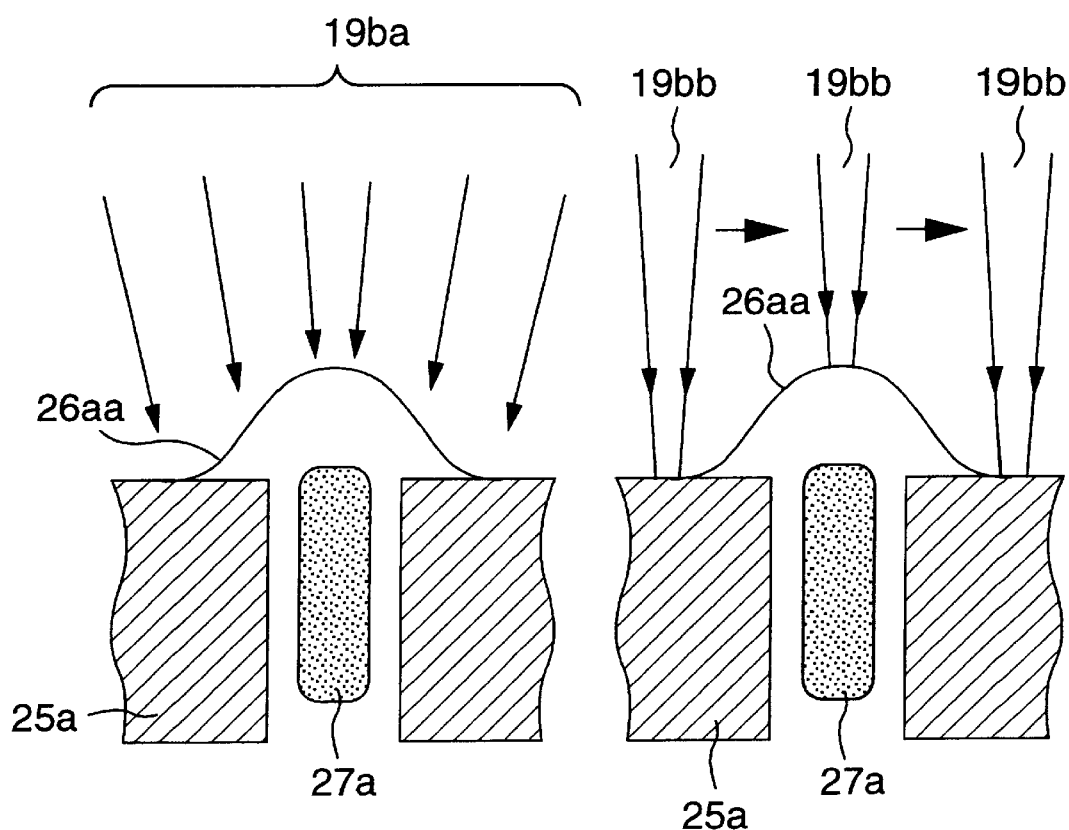

METHOD AND APPARATUS OF MANUFACTURING AN ELECTRONIC CIRCUIT BOARD

BACKGROUND OF THE INVENTION

1. Field of the Invention

The present invention relates to a method of manufacturing an electronic circuit board on which LSIs, components, etc. to be used in an electronic circuit board are mounted, and particularly to a method of manufacturing an electronic circuit board on which these LSIs, components, etc., are mounted by means of a lead-free Bi-system solder. The solder alloy can be applied in bonding electronic components such as LSIs to a circuit board made of an organic material and is an alternative to conventional eutectic Pb—Sn alloy solders used in the soldering at a temperature of from 220° C. to 230° C.

2. Description of the Related Art

There have been problems of pollution of the global environment and adverse affects on living things by lead (Pb) in a eutectic Sn-Pb solder. It is thought that the pollution of the global environment occurs when lead is dissolved by rain, etc. from the dumped lead-containing electrical appliances exposed to sunlight and rain. The dissolution of lead tends to be accelerated by the recent acid rain. In order to reduce environmental pollution, therefore, it is necessary to use a lead-free solder alloy of low toxicity containing no lead as an alternative for the eutectic Sn—Pb alloy solder which is popular. This demand can be solved by using lead-free solder alloys which contain Bi, etc., such as an Sn—Ag—Bi alloy and an Sn—Ag—Bi—Cu alloy.

However, the lead-free solders containing Bi, etc. have had a problem of lacking reliability because of exfoliation at joint portions. Furthermore, the lead-free solders have had the problem that deterioration of strength and exfoliation occur due to heating of surrounding bonding portions (which do not require repairs) during repairing.

More specifically, a phenomenon called "lift-off" is known when a lead-free Bi-system solder is used in soldering a printed circuit board. The phenomenon is of exfoliation between a land of the board and the solder that occurs after soldering. It has been known that the lift-off occurs due to segregation of Bi in a Sn—Bi alloy solder (Collection of Lectures and Papers on Circuit Mounting at Grand Scientific Lecture Meeting, p. 67, Mar. 24, 1998). However, the mechanism of the lift-off is complex and has been uncertain. Further, it is shown in a News Paper of the Nikkan Kogyo Shinbun issued on of Apr. 27, 1998 that the lift-off can be prevented by rapid cooling using water or a steam spray.

Thus, a problem to be solved by the present invention is to prevent deterioration of strength and the lift-off phenomenon at bonding portions of lead-free Sn—Ag—Bi alloy solders having a low melting point, etc. and to prevent occurrence of deterioration of strength and the lift-off of surrounding bonding portions (which do not require repairs) during repairing. Namely, when soldering is performed in an ordinary flow process by means of a lead-free Bi-system solder, the lift-off occurs between the solder and a land. If the lift-off can be prevented, it is possible to perform soldering at a temperature comparable to the soldering temperature for the conventional eutectic Sn-Pb alloy solder. A problem of damage to the solder and components and an adverse effect due to a cooling liquid (especially, corrosion of contact portions) arises simply in the case of rapid cooling.

SUMMARY OF THE INVENTION

An object of the invention is to provide a method and apparatus of manufacturing an electronic circuit board which can be free from fouling, corrosion, etc. of connector portions by relaxing thermal shocks to components, etc. without occurrence of the lift-off and without generation of cracks in the fillet portion of a solder joint.

Under the above object, according to the invention, there is provided a method of manufacturing an electronic circuit board which comprises bonding electronic components to the circuit board by means of a Bi-containing lead-free solder. The electronic components and circuit board are bonded together followed by cooling the solder at a cooling rate of from about 10 to 20° C./second.

According to one feature of the invention, in the method of manufacturing an electronic circuit board, which comprises bonding electronic components to a circuit board by means of a Bi-containing lead-free solder, the electronic components and circuit board are bonded together followed by cooling from a temperature close to the liquidus temperature to a temperature close to the solidus temperature of the solder at a cooling rate of from about 10 to 20° C./second.

According to another feature of the invention, in the method of manufacturing an electronic circuit board, which comprises bonding electronic components to a circuit board by means of a Bi-containing lead-free solder, the electronic components and circuit board are bonded together followed by cooling from a temperature close the liquidus temperature to a temperature close to the solidus temperature of the solder at a first cooling rate of from about 10 to 20° C./second and at a subsequent second cooling rate lower than the first cooling rate. The second cooling rate may be from 0.1 to 5° C./second.

According to still another feature of the invention, in the method of manufacturing an electronic circuit board, which comprises bonding electronic components to a circuit board by means of a Bi-containing lead-free solder, cooling is performed at a cooling rate of from 0.1 to 5° C. in the temperature range on or below a temperature close to the solidus temperature of the solder. The cooling may be performed with a cooling medium, such as air, inert gas, spray liquid, steam, liquid, liquid nitrogen and dry ice, at room temperature, at the highest, or below. The inert gas may be a mixture containing any one of liquid nitrogen and dry ice. Also, cooling may be performed by a flux cleaning agent, such as the Fluorinert liquid, at room temperature or less at the lowest in spray or shower form.

It was found by experiments that cracks in solder joints are prevented as stated above by rapid cooling at a cooling rate of from 10 to 20° C./second even if electronic components and a circuit board are bonded by a Bi-containing lead-free solder. Namely, it is possible to provide a method of manufacturing an electronic circuit board with few imperfections in soldering bonding portions by rapid cooling at a cooling rate of from 10 to 20° C./second.

It was also found that cracks in solder joints are prevented by slow cooling at a cooling rate of from 0.1 to 5° C./second in the temperature range on or below a temperature close the solidus temperature in the case where electronic components and a circuit board are bonded by means of a Bi-containing lead-free solder, because stress due to a temperature difference from the solidus temperature to room temperature is relieved. Namely, it is possible to provide a method of manufacturing an electronic circuit board with few imperfections in soldering-bonding portions by slow cooling in the temperature range on or below a temperature close to the solidus temperature.

It is possible to manufacture a printed electronic circuit board which is excellent in comprehensive respects by combining the two cooling ways of rapid and slow.

The above deterioration in strength and the lift-off of joints is caused by a difficulty in bonding between Cu and sulfur, which is due to segregation of Bi in the solder joint at the interface between the solder joint and the Cu land as below:

(1) When cooling after soldering, the substrate is cooled more slowly than the lead because of the higher heat capacity of the substrate than that of the lead.
(2) From the phase diagram of an Sn—Ag—Bi alloy, it is apparent that the difference between the liquidus temperature and the solidus temperature is as great as tens of degrees.
(3) Because of a high temperature of the Cu land of the substrate after soldering, the interface region finally soldifys and Bi segregates there.
(4) According to observations and analyses, it became apparent that in a joint where deterioration in strength occurs, Bi crystals segregate in a lamellar form at the interface. This means that there is no contact between Cu and Sn phases and Bi and Cu phases, are in contact with each other. It should be noted that the former combination exhibits good bonding property and the latter combination exhibits bad bonding property.

The deterioration of strength and lift-off of joints occur because of the above grounds. In order to prevent these, the temperature difference between the interface and other portions of the solder joint is reduced by cooling in a shorter time than previously in the cooling process, thereby preventing the segregation of Bi. Herein, the term "the interface" means particular portions of the solder joint, which are on or close to the interface between the solder joint and the Cu land.

The reason why the deterioration of strength and the lift-off of surrounding portions (which do not require repairing) with respect to bonding portions occur during repairing is that when a joint to be repaired is heated, surrounding joint portions are also heated and partially melted resulting in that the above problems arise during cooling.

The lift-off phenomenon is prevented by cooling at a rate of 10° C./second irrespective of the amount of Bi even when the final temperature is room temperature or 100° C. As will be understood, it is effective to perform rapid cooling down to the solidus temperature at which solidification is completed. However, it became apparent that when rapid cooling to room temperature is performed to shorten the process time, a large thermal stress is generated due to a rapid temperature change in a short time, resulting in that cracks are formed in a fillet of the solder when the solder is brittle (for example, in the case of containing 15% Bi). The primary factor of occurrence of the lift-off in rapid cooling is a temperature change in a short time. Thus, it was decided to relieve stressed by slow cooling in the temperature range on or below the solidus temperature. Therefore, it is desirable to perform rapid cooling from close the liquidus temperature to the solidus temperature, thereby accomplishing solidification in a short time, and subsequently to perform slow cooling while relieving stress.

For this purpose, the segregation of Bi is prevented by locally heating (rapid heating and rapid cooling) joint portions by a short-pulse beam (laser, infrared ray, microwave, etc.). More specifically, according to the pulse beam an object can be rapidly heated to a temperature in a short time (several milliseconds) and a local heating is possible. By locally heating the solder, a short time cooling is realized due to thermal diffusion to surrounding portions when irradiation with the laser beam is completed. In other words, rapid heating and subsequent rapid cooling can be realized by laser heating. For this reason, the Bi segregation is avoidable to prevent the lift-off, for example, by melting a joint by rapid heating through laser radiation while keeping the substrate temperature below the melting point thereof and subsequent rapid cooling by thermal diffusion.

Furthermore, it is possible to detect a bonding state of a solder joint produced by a usual process and to repair the bonding portion by irradiating a defective portion with the laser beam on the basis of the information thus obtained to perform rapid heating and rapid cooling.

BRIEF DESCRIPTION OF THE DRAWINGS

FIG. 20 is a schematic illustration of a case where a joint is irradiated at a time by means of a large convergence spot.

FIG. 21 is a schematic illustration of a case where a joint is irradiated by scanning by means of a minute dotlike or linear convergence spot.

DESCRIPTION OF THE PREFERRED EMBODIMENTS

First, the mechanism of lift-off is described with the aid of FIGS. 2 to 6.

Figure 2:
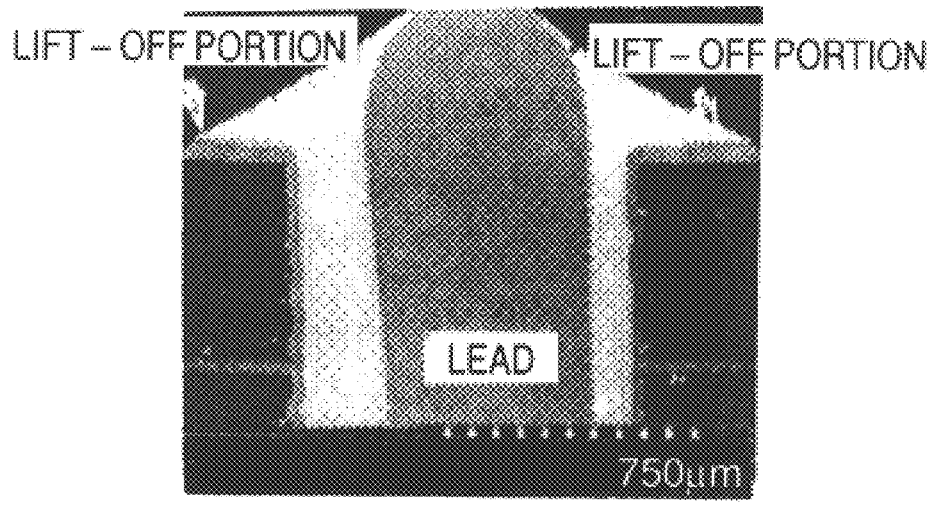
FIG. 2 is a sectional view of a Cu lead positioned in a through hole of glass-epoxy substrate and a solder joint in this through hole portion, which shows lift-off and its mechanism.
Figure 3:
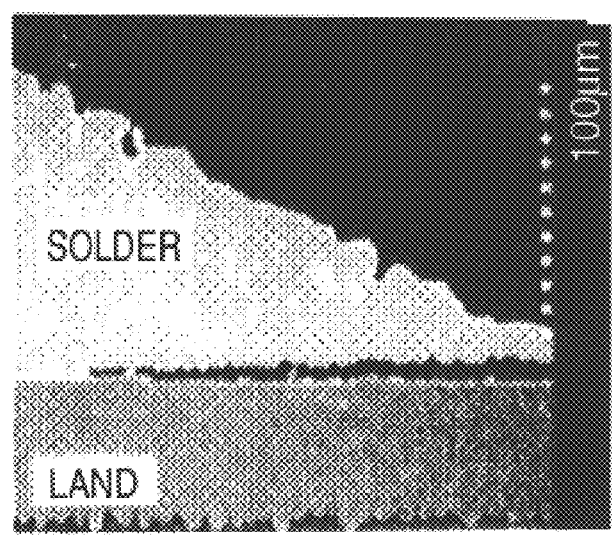
FIG. 3 is an enlarged view of the essential part shown in FIG. 2.
Figure 4:
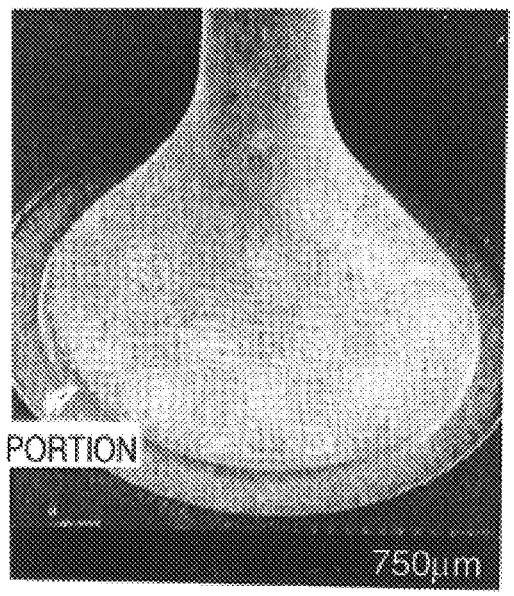
FIG. 4 is an SEM image of the appearance of the solder joint shown in FIG. 2.
Figure 5:
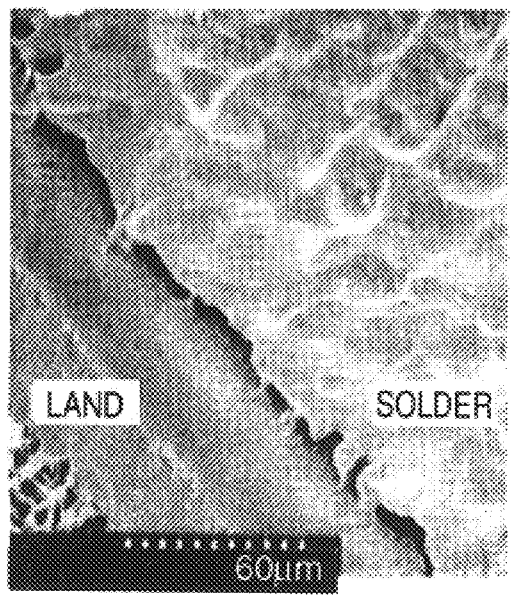
FIG. 5 is an enlarged view of the essential part shown in FIG. 4.
Figure 6:
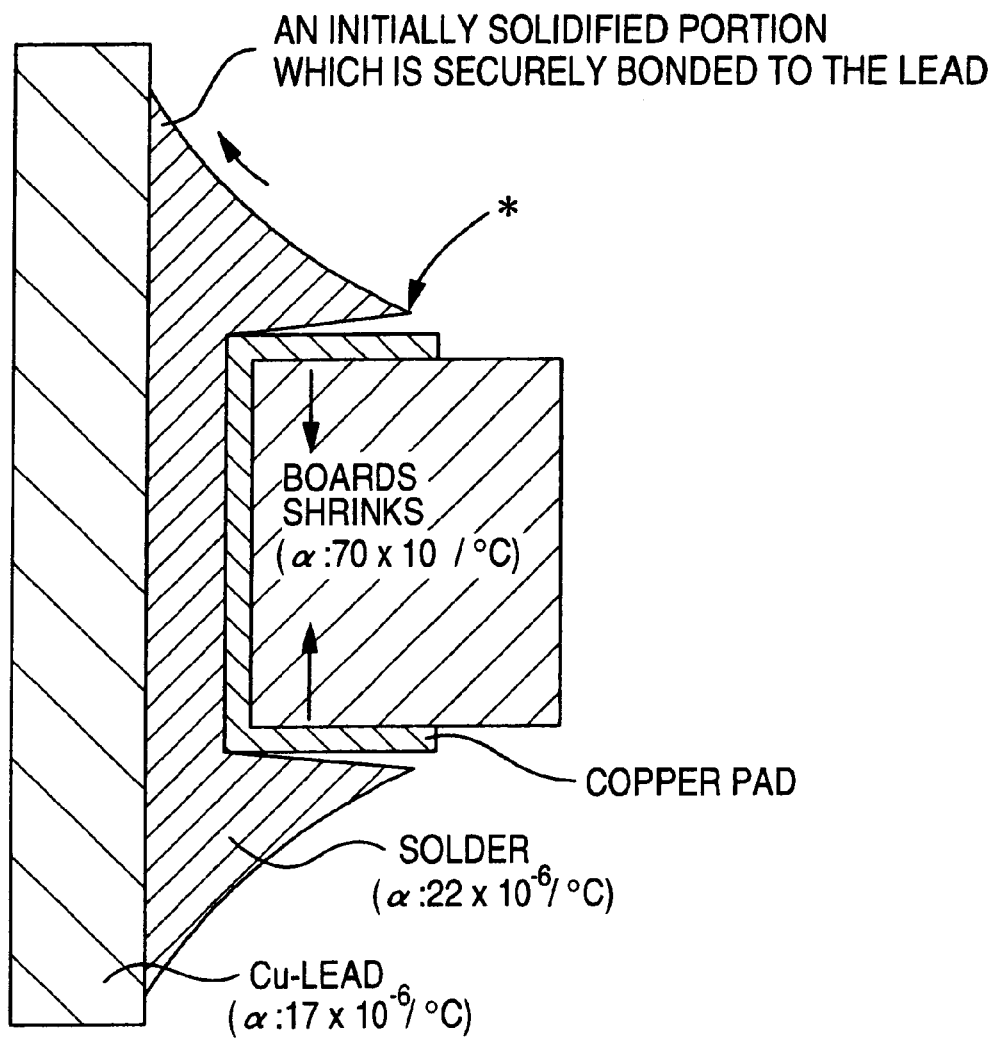
FIG. 6 is a schematic sectional view of a through hole of glass-epoxy substrate provided in a Cu pad, a Cu lead positioned in the through hole, and a solder joint, which corresponds to FIG. 2 and shows lift-off and its mechanism. (*Note: A finally soldified portion because of a high heat capacity of the board, where the Bi-phase, having a low temperature, remains finally, which is not adhesive to copper.)

FIGS. 2 and 3 show cracks in a Cu land in the section of a through hole. FIGS. 4 and 5 are SEM (Scanning Electron Microscope) images of the appearance of solder and show lift-off in a Cu land. FIG. 6 shows modeling of an example in which the through hole, being shown in FIGS. 2 to 5 in which a Cu pad is formed, and a Cu lead being inserted into the through hole are bonded by soldering.

Figure 8:
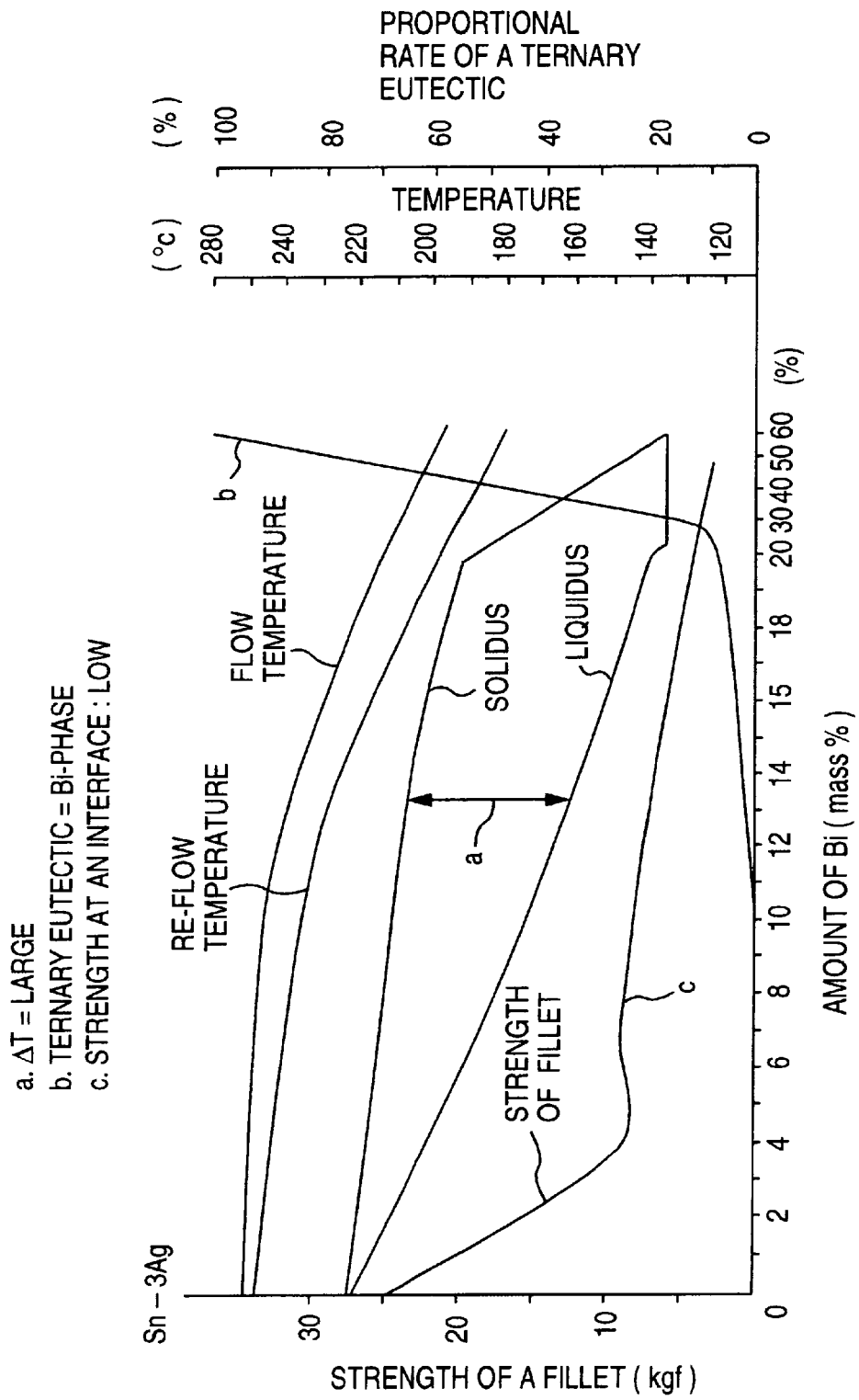
FIG. 8 shows the relationship between the amount of Bi in an Sn—Ag—Bi alloy solder and physical properties, melting properties, strength, etc.

Referring to FIG. 6, because of a higher thermal expansion coefficient of the substrate in the through-thickens direction than that of a lead (pin), causes of occurrence of the lift-off phenomenon are classified as follows: (i) a case where the lift-off phenomenon occurs due to a great temperature difference from the solidus temperature at which a constraint begins to room temperature ; (ii) a case where the lead-off phenomenon occurs due to a difference in the solidification time of solder during cooling (because the component side is a metal, solidification occurs first in the outermost end portion of the fillet and this portion stretches the unsolidified portion, as shown in the figure. During this process the Cu land exfoliates easily in association with the shrinkage of the substrate); and (iii) a case where Bi gathers in the Cu land (this case is further divided into a case where products (Bi) are formed and another case where strength decreases due to the effect of Bi even when products (Bi) are not formed). Incidentally, the case of "ii" is caused by the temperature difference between the liquidus and the solidus and by the solidification process, and the case of "iii" is caused by the segregation of Bi (this relationship is shown in FIG. 8, which will be explained later).

Next, in order to clarify the lift-off phenomenon of lead-free Bi-system solders, various experiments were carried out on solders of Sn-3 mass % Ag (hereinafter merely referred to "Sn-3Ag") with the amount of Bi as a parameter. The lift-off phenomenon was studied on the basis of data obtained from the experiments and physical properties of the material.

Figure 1:
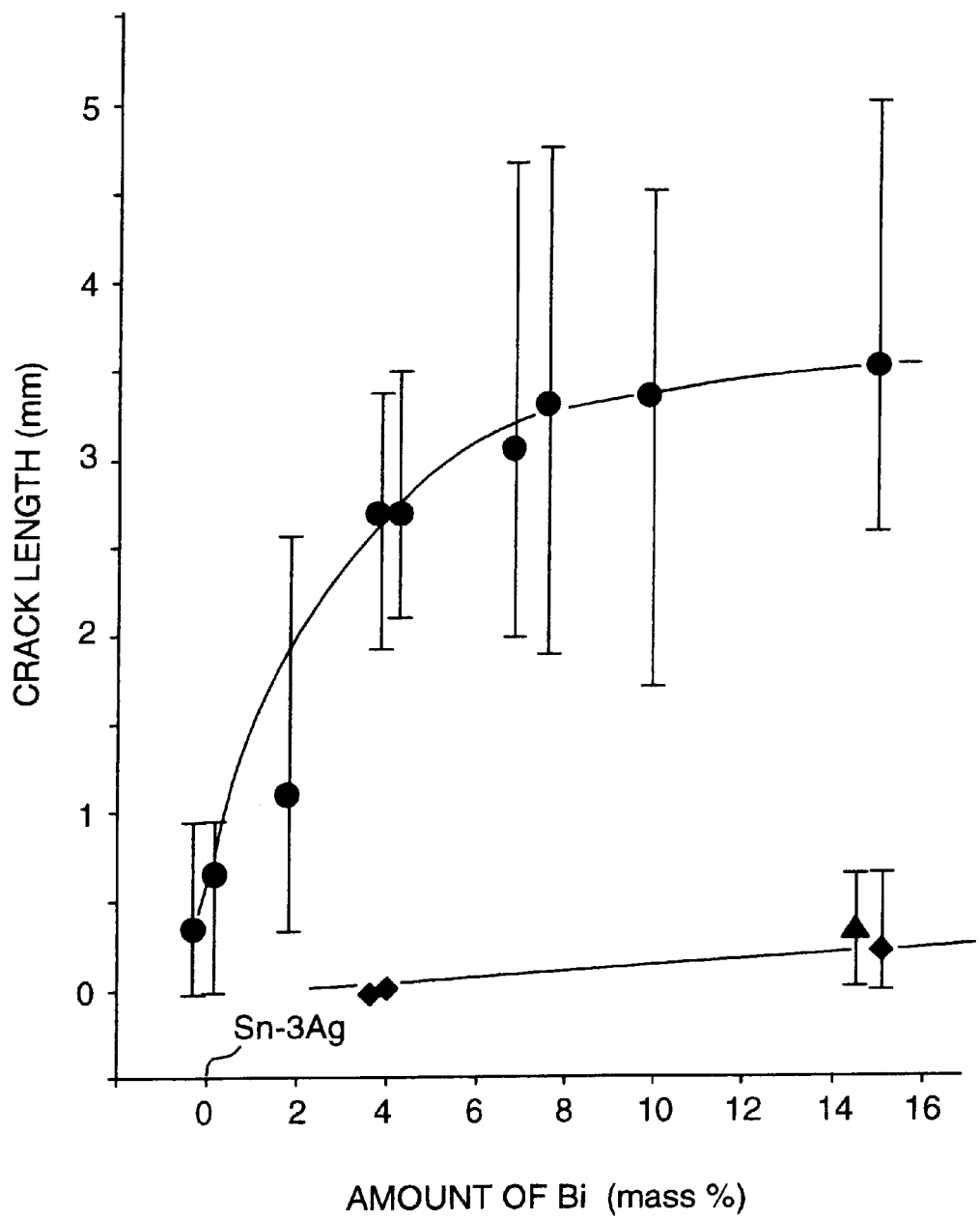
FIG. 1 shows the relationship between the amount of Bi and the crack length in a land.

Respective specimens for the lift-off experiment were prepared by inserting pins of a DIP (Dual Inline Package) into the through holes of a 6-layers glass-epoxy substrate having 1.6 mm of thickness. Thereafter, a flux of rosin containing a slight amount of acid was applied to the substrate. The substrate was, next, immersed into a molten solder bath. The thus flux-applied substrate, in which the pins were bonded onto the Cu-land in the through hole, was cooled while varying the cooling rate so that the specimen was finally prepared. Varying the cooling rate was carried out in air and hot water which make the experiment easy. The cooling rate was measured by fixing the tip of a thermocouple on the land with heat-resistant tape. For all chemical compositions, soldering was performed under soldering conditions of 250° C. for 3 seconds. The hole diameter of the substrate was 1.0 mm and the land diameter was 1.6 mm. With regard to the lift-off phenomenon, appearances were observed under a low magnification by an electron microscope, thereby a length of exfoliation along the Cu land was determined to show in FIG. 1 in which there are shown the relationship between the amount of Bi and the length of an exfoliation (crack length) of the lift-off when Bi was added in amounts of 0, 2, 4, 7, 10 and 15%, respectively, to Sn-3Ag solder.

It was found that the lift-off occurs in all chemical compositions at a cooling rate of about 1° C./second (see the circular black spots), which is the cooling rate in the usual flow soldering.

Next, the specimens were immersed in normal water (at room temperature) and hot water (at 100° C.), respectively, just after soldering in order to vary the cooling rate greatly. In normal water and hot water the cooling rate could be varied in the range of from 5 to 40° C./second. It was found from the experiment that the lift-off phenomenon does not occur in hot water cooling (see the square black spots) at a cooling rate of from 10 to 20° C./second and that the appearance is also excellent (cracks are not formed). It was also found that, in the case of water at room temperature at a cooling rate of about 40° C./second (see the triangular black spots) the appearance is not so good as with cooling in hot water although the lift-off phenomenon does not occur. In other words, it was found that cracks are sometimes formed at a cooling rate of 40° C./second because the cooling rate is too high and impractical. It is noted that the higher the cooling rate was the more easily the segregation of Bi could be prevented.

As mentioned above it became apparent that although it is advisable to increase the cooling rate in order to restrain the segregation of Bi, which is considered to be one of the causes of lift-off, it is better to use cooling rates lower than about 40° C./second in order to restrain occurrence of cracks in solder. It became also apparent that particularly a cooling rate of from 10 to 20° C./second is good. It was found that the factors of "ii" and "iii" shown in FIGS. 2 to 6 can be solved because rapid cooling eliminates time differences in solidification between regions of the solder.

On the other hand, in the case of Sn-3Ag, it was found that the fact that occurs without Bi due to the factor "i" shown in FIGS. 2 to 6 and because the substrate cannot withstand large thermal stress resulting from a temperature difference from 221° C. to room temperature. In other words, it became apparent that, because the through-thickness thermal expansion coefficient of the substrate ($70 \times 10^{-6}$/° C.) is very large compared to the lead material (42-alloy: $4 \times 10^{-6}$/° C., a copper-system material: $17 \times 10^{-6}$/° C.) and solder ($20 \times 10^{-6}$/° C.), the substrate shrinks greatly in the through-thickness direction during temperature falling from the solidification temperature of solder at 221° C. to room temperature to cause the lift-off. Thus, it was found that thermal stress considered to be one of the causes of lift-off can be restrained by slow cooling at a rate of from 0.1 to 5° C./second in the temperature range on or below the solidus temperature of solder.

Figure 7:
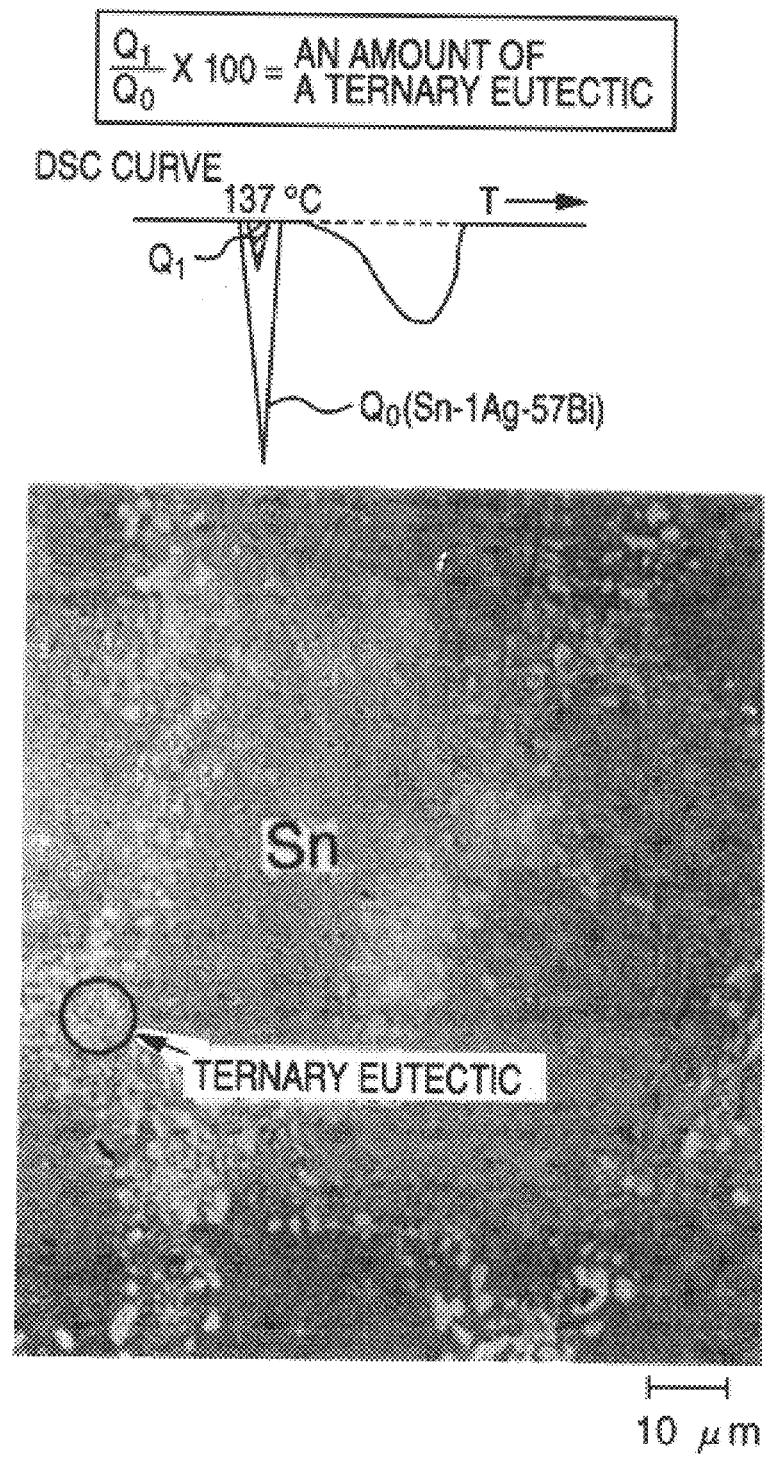
FIG. 7 shows the principle of measurement of the amount of a ternary eutectic contained in a Bi-system solder.

FIG. 8 shows more clearly the results shown in FIG. 1 and FIGS. 2 to 6, i.e., relationships among the chemical composition of an Sn—Ag—Bi alloy solder and physical properties, melting properties, strength, etc. The respective proportional rate of a ternary eutectic (Sn-1Ag-57Bi) in FIG. 8 was determined on the basis of such a manner illustrated in FIG. 7 which shows a metal structure of an Sn-3Ag-57Bi (consisting of a coarse Sn crystal and a fine ternary eutectic of Sn-1Ag-57Bi) and a Differential Thermal Curve. According to FIG. 7, with regard to an Sn-3Ag—Bi solder alloy, for example, the area $Q_1$ of the reaction region of the ternary eutectic (Sn-1Ag-57Bi) at 137° C. in its Differential Thermal Curve was measured, while the area $Q_0$ of the reaction region of the ternary eutectic (Sn-1Ag-57Bi) in the Differential Thermal Curve was also measured. When determining the proportional rate, a rate of area $Q_1$ to the area $Q_0$ is calculated, wherein the area $Q_0$ is a reference value of 100%.

As shown in FIG. 8, when the amount of Bi is not less than 7.5%, the strength at the interface is low (ii) and a ternary eutectic exists. Further, the temperature difference $\Delta T$ between the liquidus and the solidus (i) also increases and the lift-off phenomenon is liable to occur. However, in the case of the ternary eutectic containing a large amount of Bi (Sn-1Ag-57Bi), the lift-off phenomenon does not occur because the temperature difference $\Delta T$ is small and because, at the same time, the temperature difference from the solidus temperature (137° C.) to room temperature (20° C.) in the mode (i) is small.

On the other hand, in chemical compositions of small amounts of Bi, for example, about 2% Bi, almost the same good results were obtained even at cooling rates of not higher than 10° C./second. In other words, in chemical compositions of small amounts of Bi, the solidus temperature is high, the temperature difference between the liquidus and the solidus is also small, and the strength at the bonding interface is also high. For this reason, the lift-off phenomenon hardly occur and, therefore, it is possible to use a cooling rate of about 5° C./second. From the above it was found that the lift-off phenomenon depends on the interrelationship among the temperature difference between the liquidus and the solidus, the cooling rate, and the bonding strength at the joint interface as well as the chemical composition of the solder.

For this reason, the cause of deterioration of strength at the bonding interface varies with the amount of Bi. As can be seen from FIG. 1 also, it is evident that the curve is inflected at about 4% to 6% Bi. It is presumed that there are different phenomena at left and right side of the inflection point. When the amount of Bi is at the right side of the inflection point, the ternary eutectic containing a large amount of Bi (57%) having the low-melting point exists. It is expected, therefore, that in this case, Bi phases combine with one another to become coarse so as to segregate along the interface. It is apparent that when Bi, which is hardly react with Cu, aggregates at the interface between the solder and Cu, the lift-off occurs easily because Bi is not connected to Cu.

On the other hand, when the amount of Bi is at the left side of the inflection point, that is, when the solder has a relatively high melting point, a uniform Bi phase is not observed at the interface. It is pressumed, however, that even in a solder having small amount of Bi, Bi aggregates near the interface of a land in the final stage of solidification, though not in such an amount as to allow the Bi segregation at the interface as the solidification process. As a result, the amount of Bi shown in FIG. 8 appears as the cause of deterioration of strength in the range of zero to the inflection point.

While the amount of Bi increases in this range, the strength decreases linearly, however, the amount of Bi at the bonding interface is at such a level as may not be detected by an XMA (X-ray microanalyzer) analysis and the Bi aggregation is not regarded as the Bi segregation. It has so far been ascertained that in Sn—Pb alloy solders, Bi therein impedes them to compounds between Cu and Sn, constituting one of causes of decrease in strength and that strength at the interface decreases with increasing amount of Bi in solder (Yamamoto et al.: Journal of Japan Society of Circuit Mounting, Vol. 10, No. 6 (1885.9)). From this it might be thought that this case is similar to the ascertained fact in terms of phenomenon. Namely, it is presumed that net bonding portions between Cu and Sn in a very thin layer of molecular level decreases at the interface with increasing amount of Bi, causing a decrease in strength. It might be thought that the existence of a ternary eutectic in the DSC curve has a relation to the above decrease in strength because it appears near this point, though this depends on the temperature gradient of heating and cooling. The boundary value of Bi amount at the interface is delicate and has a great effect on diffusion whether heat treatment and aging are performed or not. Therefore, it is expected that this value deviates more or less.

From the above experiment results it became apparent that as the process conditions for avoiding lift-off, it is desirable to prevent the decrease in strength caused by the segregation of Bi at the interface by avoiding precipitation of Bi at the interface, i.e., by dispersing Bi in solder, which is accomplished by performing rapid cooling at a rate of from 10 to 20° C./second to the solidus temperature at which solidification is completed. It was possible to ascertain by experiments that there is no Bi layer, which usually precipitates at the interface, when this rapid cooling is performed and that Bi is widely dispersed in solder by rapid cooling. It was also possible to ascertain that cracks are not formed in solder.

On the other hand, a main cause of the formation of defects in rapid cooling is a temperature change that occurs in a short time. In this connection, it became apparent that it is desirable to relieve stress due to a temperature change that occurs in a short time by performing slow cooling at a rate of from 0.1 to 5° C./second in the temperature range on or below the solidus temperature in order to reduce generation of thermal stress.

Incidentally, because the cooling rate has a relation to the heat capacity of the substrate also, it is necessary to cool the substrate with a cooling medium at a temperature on or below the solidus temperature in order to improve the cooling effect. In particular, when the cooling medium is a gas, which essentially has a small heat capacity, rapid cooling cannot be realized unless the cooling effect in the initial stage is improved by lowering the temperature to on or below room temperature in order to raise the overall cooling effect. Even when a gas whose temperature is lower than room temperature is used in the initial stage, thermal shocks have little adverse effect on components and substrate. The use of a gas has the merits that the gas does not destroy a flux which is applied after soldering and forms a protective film, that the gas has no effect on the contacts in the connector, and the like.

Thus, as a desirable process is to effect solidification in a short time by performing rapid cooling during cooling from a temperature close to liquidus temperature to the solidus temperature and subsequently performing slow cooling to relieve stress. An optimum cooling medium in terms of cooling capacity is a liquid. Those having a boiling point near the solidus temperature are ideal in terms of cooling capacity and in the case of the Fluorinert liquid, it is to a certain degree possible to select materials. When a liquid transforms rapidly into a gas, latent heat is taken away, enabling the cooling effect to be improved.

Figure 9:
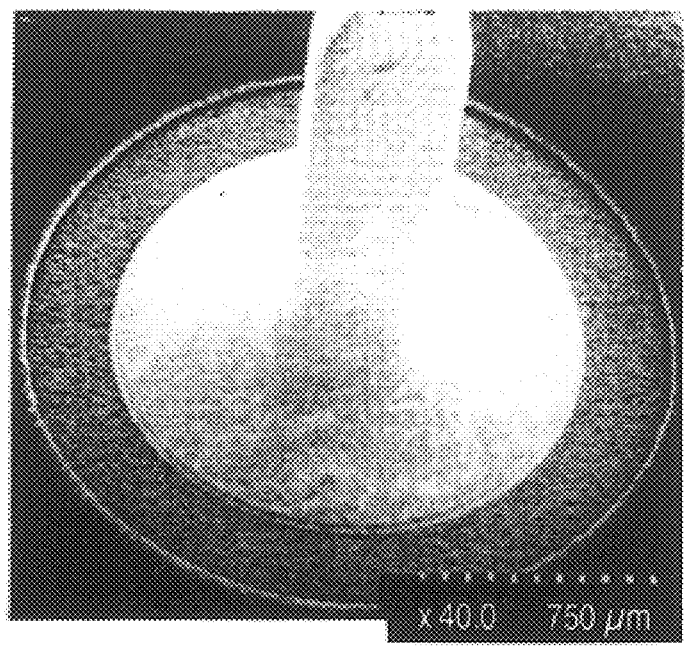
FIG. 9 is an SEM image of the appearance of a solder joint (through hole joint) obtained by immersion in water at room temperature lowered from a temperature of 205° C.
Figure 10:
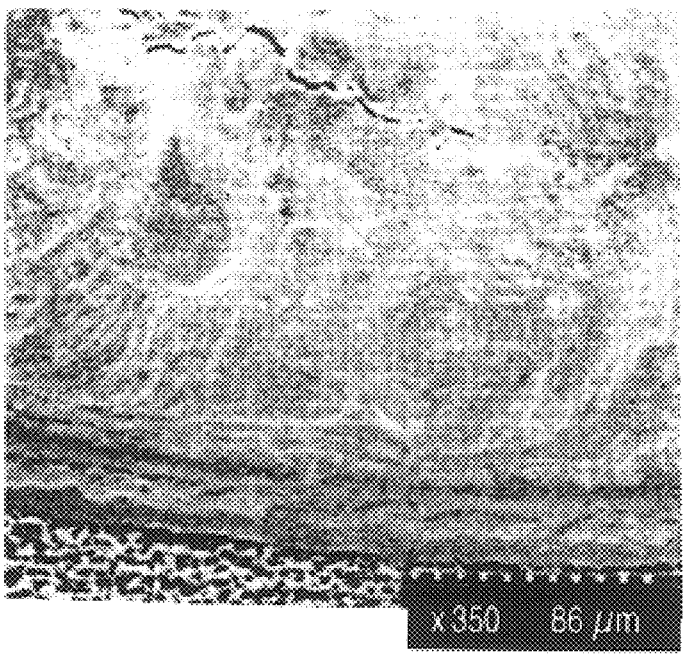
FIG. 10 is an enlarged view of the essential part shown in FIG. 9.

Since the ternary eutectic precipitates in the alloy system containing 7.5% or more Bi the solidus temperature is 137° in this case. In order to improve the cooling effect, the cooling temperature can be lowered similarly in such a range as to have no thermal effect on the substrate, components, etc. However, mechanical properties of the solder itself and, in particular, elongation have almost the same tendency as bonding strength characteristics shown in FIG. 8 with respect to a change in the amount of Bi. Therefore, in some sizes and structures of substrate and components, cracks of solder itself (intergranular fracture) and defects at Sn grain boundaries (occurrence of microvoids) appear for chemical compositions containing a large amount of Bi even if the lift-off is avoided. For a 15% Bi solder, cracks occurred similarly even in the case of rapid cooling by immersion in hot water at 100° (10°/second) as well as in the case of the rapid cooling in water shown in FIGS. 9 and 10. This is because, while large stress can be relieved overall the solder, the solder has inferior mechanical properties due to a large amount of Bi. Thus, in order to ensure an ideal process for the alloy system of large amount of Bi, it is necessary to perform slow cooling after rapid cooling to the solidus temperature. The cooling effect in a solder containing 15% Bi was compared between rapid cooling in hot water at 100° C. and rapid cooling at 137° C. in silicon oil. The superiority of the latter cooling at 137° C. was verified in terms of the appearance also.

Figure 11:
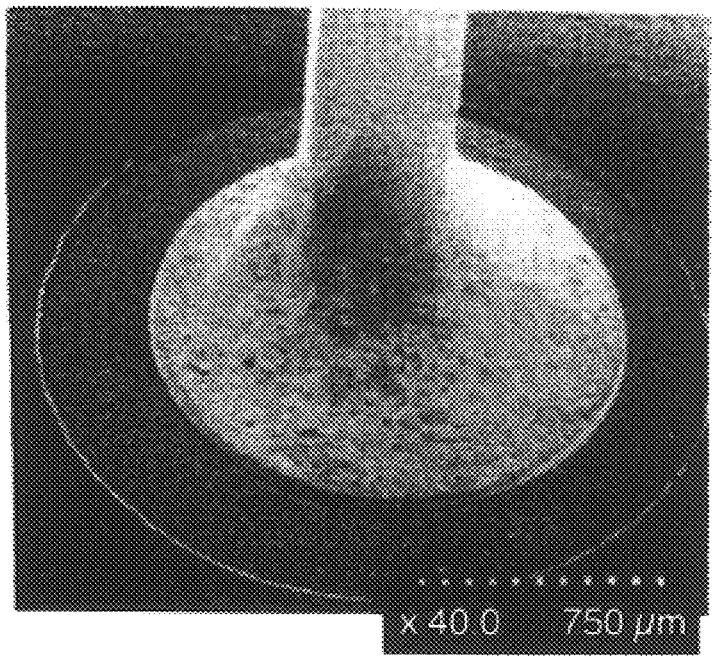
FIG. 11 is an SEM image of the appearance of a solder joint (through hole joint) obtained by immersion in water at a temperature of 100° C. lowered from a temperature of 216° C. and holding at 100° C.
Figure 12:
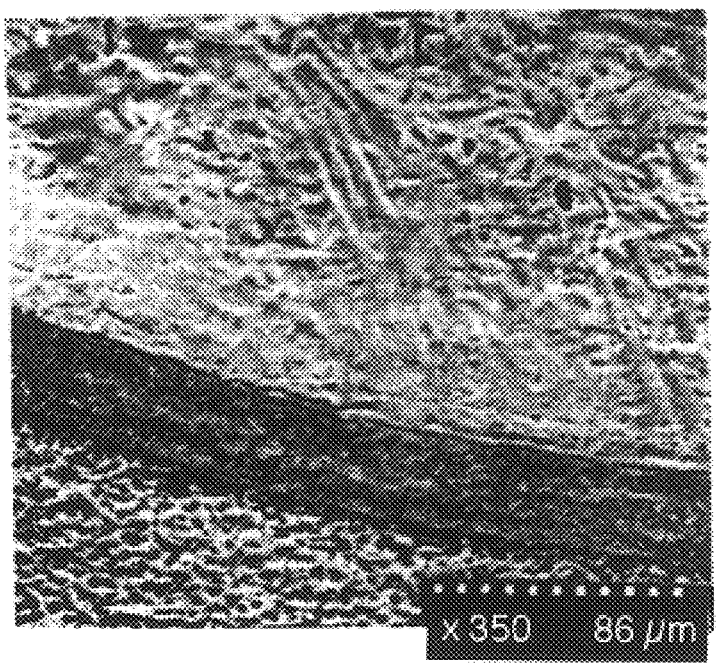
FIG. 12 is an enlarged view of the essential part shown in FIG. 11.
Figure 13:
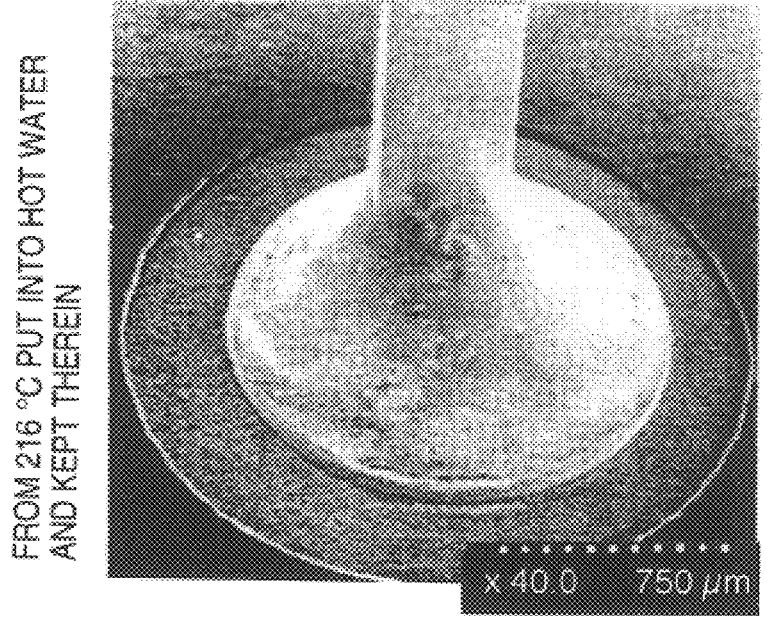
FIG. 13 is an SEM image of the appearance of a solder joint (through hole joint) obtained by immersion in water at a temperature of 100° C. lowered from a temperature of 216° C. and holding at 100° C.
Figure 14:
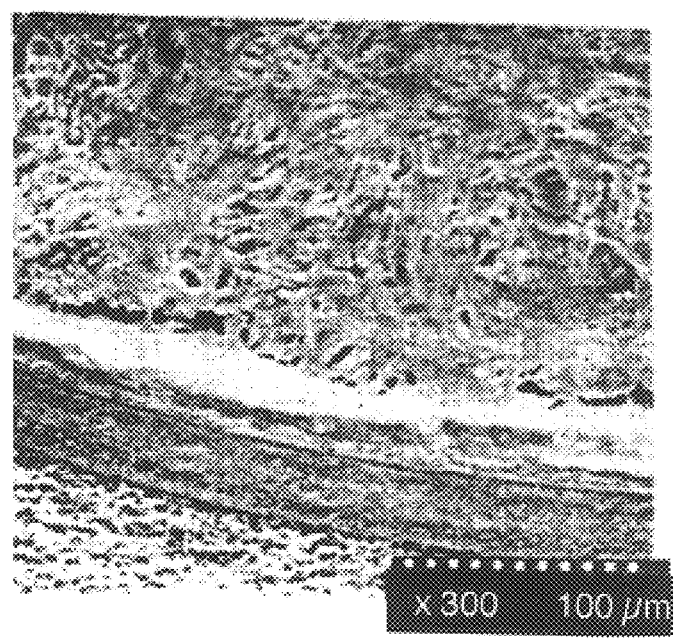
FIG. 14 is an enlarged view of the essential part shown in FIG. 13.

On the other hand, while a solder containing 4% Bi, which is lower than 7.5% Bi, the solidus temperature is 200° C., the lift-off can be prevented in this solder by in hot water at 100° C. (10°/second) or water at room temperature (40° C./second) and there can not be observed any defects such as cracks (intergranular fracture) and microvoids. However, a comparison of the photographs of the appearance of both cases reveals that for the alloy system having smaller amount of Bi, the appearance in the case of immersion in hot water at 100° C. (FIGS. 11 and 12) is apparently better than that obtained in the case of immersion in water (FIGS. 13 and 14).

Therefore, in the alloy system containing small amount of Bi, it is possible to lower the temperature to 100 to 150° C. which is below the solidus temperature in order to improve the cooling effect. The reason why defects are hardly to be produced seems to be that the bulk solder has good mechanical properties. Namely, the smaller the amount of Bi, the better the mechanical properties of joints.

In the case where the flux is rinsed, at a temperature near the solidus temperature of solder or, in the solder alloy system containing a smaller amount of Bi, cleaning and cooling effects can be simultaneously expected by cooling with spraying or slowering the Fluorinert liquid, etc., to 100 to 150° C. so that the lift-off phenomenon can be prevented. In this cleaning and cooling process, it is essential to install a recovery system for cooling and cleaning liquids. In the cleaning process, it is necessary that components of the flux be dissolved in the cleaning liquid.

In the case of water or water spray, it is necessary to use a water-soluble flux. However, incomplete cleaning poses a problem in this case. When water is used, the process is structurally limited because the problems of fouling, corrosion, rust, etc. due to adherence to contacts such as a connector remain although the cost is low.

A process without flux cleaning is popular. However, in the cleaningless process, it is desirable to spray cooled air as the cooling medium or nitrogen for preventing the oxidation at high temperatures from the two sides of the substrate. Such process may be carried out in such a manner that cooled air or nitrogen is first sprayed to cool the substrate down to the solidus temperature of solder and subsequently ordinary air is blown the substrate not so as to break the protective film of flux and for slow cooling, give thermal shock to the substrate, component, etc. When a liquid (e.g. water) is used as the cooling medium, there is a possibility that local breakage or nonuniform adherence of the protective film of flux coating on the solder may occur due to high-temperature water, shower and sprayed water, causing deterioration of insulating properties. It is necessary to adopt a cooling method that is possible without giving cracks to the flux coating. When water is used, it is important that water be instantaneously vaporized and that impurities not remain in contacts. A process in which purity is also considered should be adopted with consideration given to the effect of residues.

As a method of immersion in a liquid, it is possible to cool mainly the soldered side. When a connector is used, it is also possible to adopt a process in which the soldered side is immersed in the same manner as in soldering to prevent a liquid from entering the connector. In this case, an air, spray, shower, etc., may be combined on the component side. Incidentally, it is necessary to control the liquid temperature so that it is maintained constant.

Figure 15:
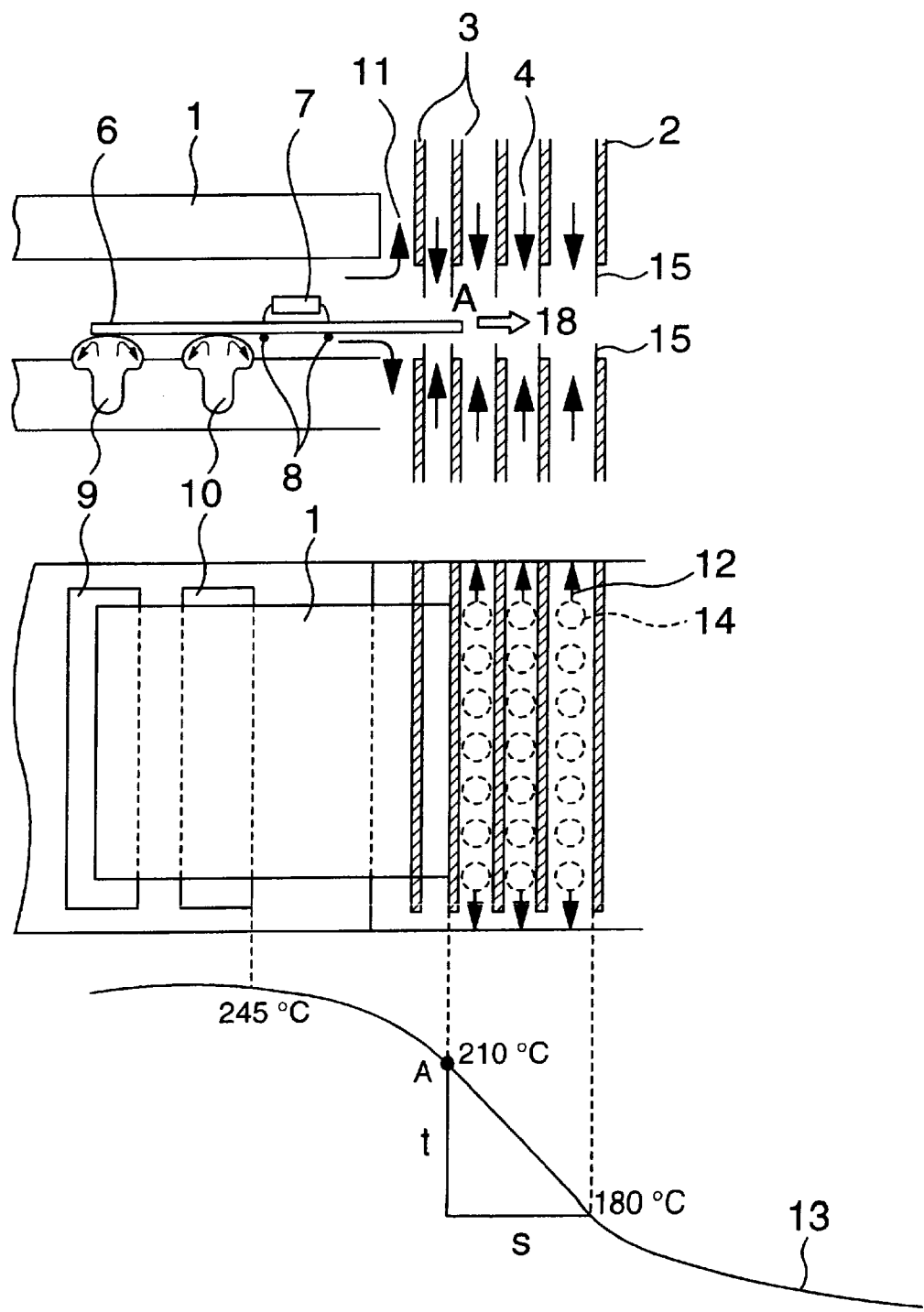
FIG. 15 is a sectional view and a plan view of an example of application of a nitrogen atmosphere to flow soldering.

Next, an example of application of a double-wave nitrogen atmosphere to flow soldering is shown in FIG. 15 in which the upper part is a cross sectional view and the lower part is a plan view. Numeral 1 denotes a nitrogen chamber unit. A printed-circuit board 6 on which a part 7 provided with pins 8 is mounted, moves to the cooling process via a primary jet nozzle 9 and a secondary jet nozzle 10. In this embodiment, there was used an example solder of Sn-3Ag-7.5Bi (liquidus temperature=210° C., solidus temperature=188° C.). In order for rapid cooling of the substrate without disturbing the flow of the nitrogen atmosphere immediately after the flow soldering, a curtain of heat shield panel 3 is installed between a furnace and a cooling mechanism and a heat-resistant film 15 is attached to the end of the heat shield panel so that the passage of the mounted part is not impeded. Cooled air 5, 4 is introduced from a refrigerator via nozzles 14 to flow through between the heat shield panels and between cooling panels 2 behind the heat shield panels. Nitrogen 11 coming out of the nitrogen chamber 1 is drawn upward and downward (in part, nitrogen or air 5 coming from between the heat shield panels also mixes in), thus improving the cooling effect. The nitrogen or air coming from between the heat shield panels and the air coming from between the cooling panels are drawn in mainly on both sides 12 while the substrate is present. The numeral 13 indicates the temperature of a land of the substrate while the substrate is passing through each portion. This temperature is 245° C. in the soldered portion. The temperature immediately after the passing before the heat shield panels 3 was controlled to 210° C., which is the liquidus temperature of the solder. The temperature upon passage before the cooling panels was controlled to about 180° C. a little lower than 188° C. of the solidus of solder. Incidentally, in some samples a good effect is also obtained by cooling at 150° C. (137° C. or higher). The lift-off can be prevented by cooling at a cooling rate of 10° C./second. A profile of temperature (t) and time (s) is shown in the lower part of FIG. 15. The temperature gradient of the substrate land at point A where rapid cooling is performed is 10° C./second. Incidentally, in a case where a ternary eutectic precipitates, it is necessary to consider 137° C. as the solidus temperature. It is effective to lower the temperature of the cooling medium, to increase the flow rate, and to reduce the transferring speed of the substrate in order to improve cooling efficiency. It is effective to use a liquid as the cooling medium for rapid cooling. The rapid cooling may be made easy by providing a zone of keeping a constant temperature, since any turbulence on the flow portion is eliminated. Incidentally, the slow cooling was performed at about 1OC/second because it is necessary to perform cooling in the temperature range on or below 180° C. while relieving residual stress and strain. Sound joints can be obtained by this. In other chemical compositions of solder also, it is possible to perform process control for prevention of lift-off suited to the melting properties of solder.

Figure 16:
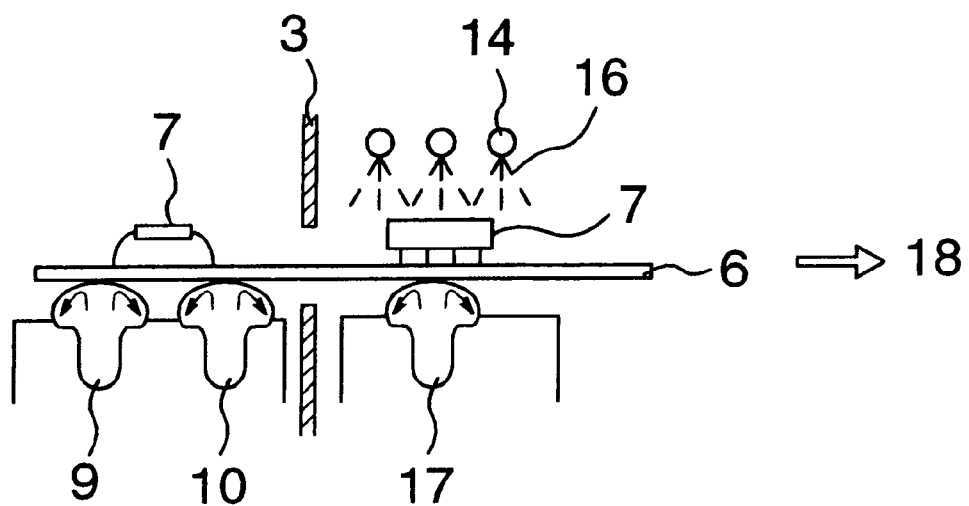
FIG. 16 is a sectional view of an example of application to flow soldering.

Next, an example of application to a flux cleaning process in which nitrogen is not used is shown in FIG. 16 which illustrates a method of cooling by immersion in the Fluorinert liquid 17 having a high boiling point after passage before a heat shield board 3. Nitrogen or air 16 may be blown onto the face of a part 7. Also, the face of a part 7 may be sprayed or showered with the Fluorinert liquid. This method is possible by a series of flow processes and the flow bath of fluorinated liquid is maintained at a constant temperature by means of a refrigerator. The same method as shown in FIG. 15 is possible as the temperature control process for the substrate. In this case, if water is used in place of the Fluorinert liquid, it is important for water to control temperature and impurities are important.

According to the above rapid cooling in the flow process, it is expectable for reflow joints, which have been clearly finished, to be subjected to the rapid cooling effect so that the Bi segregation is prevented in the reflow joints resulting in high joint reliability.

The above description has been provided with regard to the lead-free Sn—Ag—Bi alloy system solder merely as example. However, because the lift-off phenomenon occurs due to the temperature difference between the liquidus and the solidus even in those alloy systems that do not contain Bi, such phenomenon can take place also in other Sn alloy systems, for example, a Sn—Sb system, a Sn—Cu system, a Sn—Zn system and a Sn—In system. It is needless to say that the application of similar measures and techniques is possible in these alloy systems. As a matter of course, the Ag content is not limited to 3%.

Figure 17:
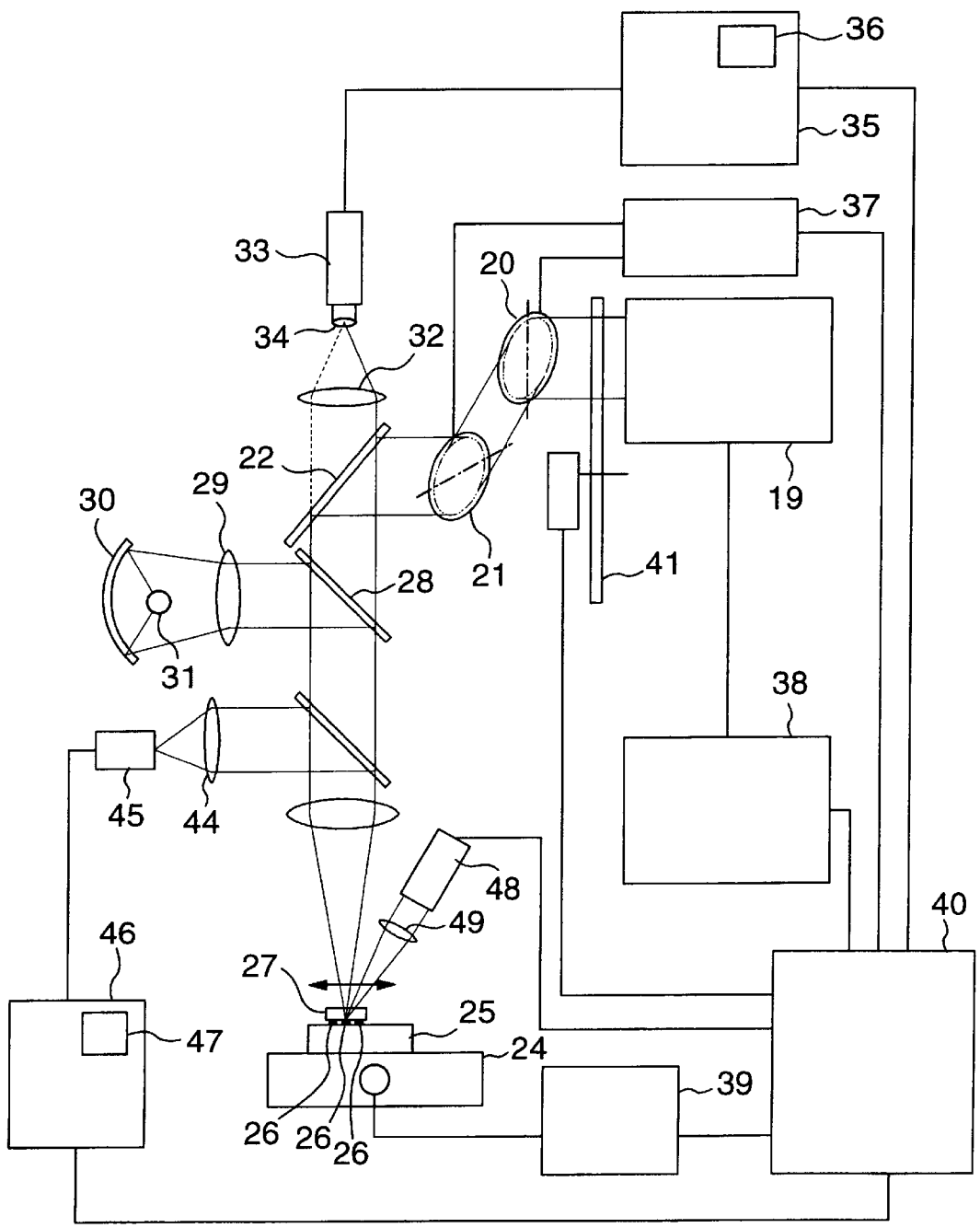
FIG. 17 is a block diagram of an apparatus for preventing Bi segregation by local heating (rapid heating and rapid cooling) by laser beams according to the present invention.

FIG. 17 shows an apparatus for preventing the segregation of Bi at the interface of a solder joint by rapidly heating the solder joint by means of laser beam irradiation and subsequent rapid cooling, which is accomplished by heat transmission to the surrounding non-irradiated portions.

In FIG. 17, the laser light coming from a laser oscillator 19 is reflected first by galvanomirrors 20 and 21 and then by a half mirror and is converged on a sample placed on a sample bed 24 by means of an objective lens 23. In this case, a component 27 is used as a sample, which is mounted on an electronic circuit board 25 and whose lead wires, etc. have been previously provided with a lead-free solder. A solder joint portion 26 of the component 27 is heated by irradiation of converged laser light.

The sample bed 24 and the sample reflect the illumination light coming from a lighting lamp 31 by means of a reflecting concave mirror 30. The illumination light is then reflected by a half mirror 28 via a lens 29 and is projected on the sample to illuminate it, and the resulting scattered light forms an image on an image pickup face 34 of a detection camera 33 via an image-formation lens 32 installed above a half mirror 22. A detection and recognition device 35 displays an image signal coming from the detection camera 33 on a monitor 36, recognizes the position and shape of the sample, the position and shape of the part, the position and shape of the solder joint, etc., and sends an image information signal to CPU40. A galvanomirror driving and controlling section 37 drives and controls the galvanomirrors 20 and 21, thereby controlling the direction of laser beams. A laser power supply and control section 38 performs the driving and output control of the laser oscillator 19. A sample bed driving and controlling section 39 performs the driving and control of the sample bed 24.

The CPU40, which performs the control of the whole system, receives image signals from the detection and recognition device 35 and sends control signals to the sample bed driving and controlling section 39, the laser power supply and control section 38 and the galvanomirror driving and controlling section 37, thereby ensuring that the position of the sample to be irradiated is irradiated with laser beams.

The laser oscillator 19, which is, for example, a pulse YAG laser or an Ar laser, controls the number of radiation pulses and number of cycles and can control transmission intensity by means of a transmittance variable filter 41 driven and controlled by a drive and control section 42.

The numeral 43 indicates a half mirror, the numeral 44 an image-formation lens, the numeral 45 a thermal-image detection section, and the numeral 46 its control and display unit, which displays the two-dimensional distribution of the temperature of sample face by images. This unit enables the distribution of the temperature of sample face to be displayed on a display 47 while obtaining an image of the sample face. Therefore, the temperature of a component irradiated with laser beams and the surrounding temperature can be measured in real time. The numeral 48 indicates an infrared lamp or laser for preheating, which emits infrared or laser light under the control of CPU40 and preheats solder joints 26 by converging the infrared or laser light by means of a lens 49 and irradiating the solder joints with the infrared or laser light.

Figure 18:
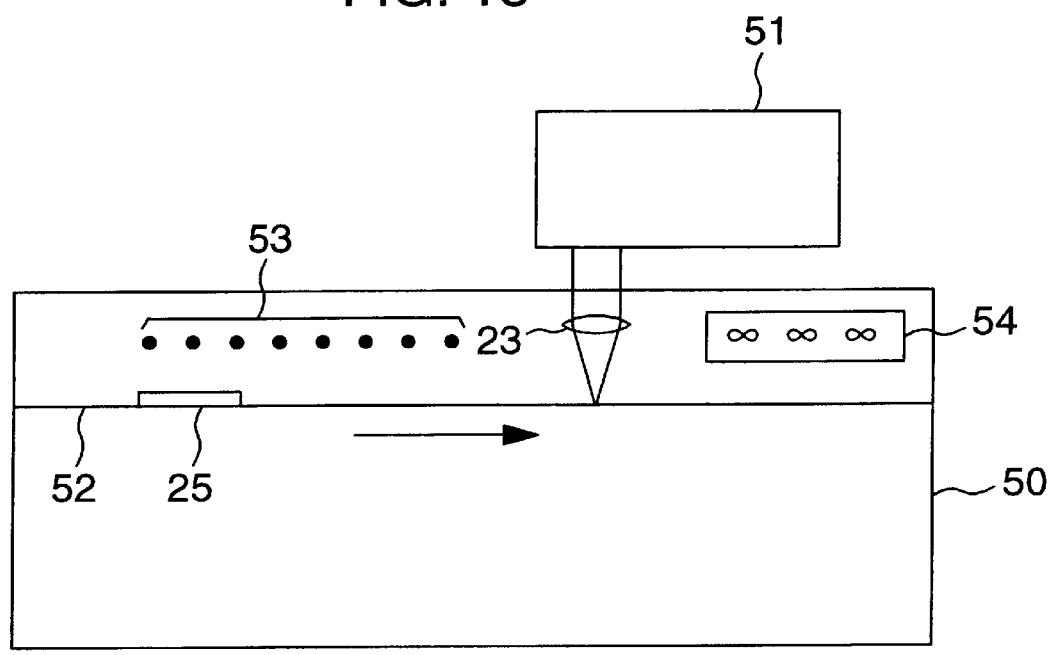
FIG. 18 is a schematic illustration of application of a laser irradiation system of the present invention to a reflow device of solder.

FIG. 18 shows the laser irradiation system shown in FIG. 17, which is installed in an ordinary reflow device of solder. A sample being heated by a high-temperature air flow in a heating furnace is irradiated with laser beams. A conveyor 52 on which a component 7 is loaded moves in a reflow device 50 and a substrate 25 is heated by a heater 53. The numeral 54 indicates a cooling fan and the numeral 51 indicates the laser unit shown in FIG. 17 from which the sample bed is removed. Ordinary heating by a heater, irradiation with laser beams, cooling by a fan, etc., can be carried out in sequence by means of the system shown in FIG. 18.

Figure 19:
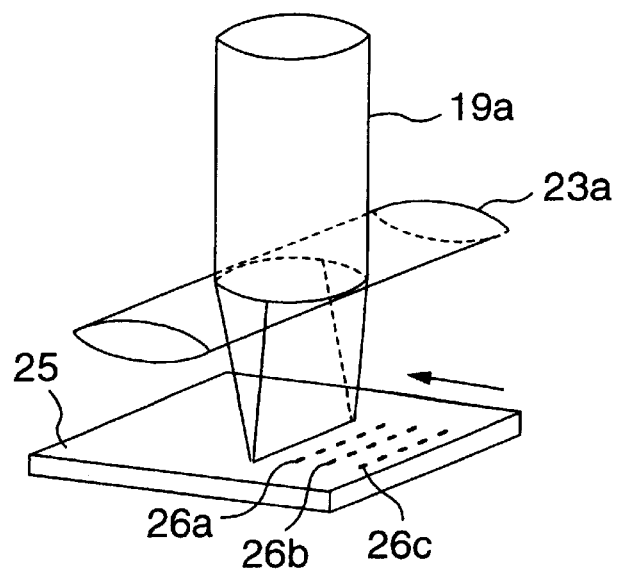
FIG. 19 is a schematic illustration of the essential part of an apparatus for performing linear beam irradiation using a cylindrical lens in place of the objective lens shown in FIG. 17.

FIG. 19 shows an embodiment in which a linear convergence area is obtained by means of a cylindrical lens 23a as the objective lens shown in FIG. 17, rows composed of a plurality of solder joints 26 are irradiated with this linear convergence area and the rapid heating and rapid cooling treatment of multiple rows of joints 26a, 26b, 26c . . . in multiple rows is performed by moving this irradiated area. More specifically, an almost circular beam 19a is converged on a linear spot 19b from the cylindrical lens 23a as the objective lens and the solder joints 26a in row on a substrate 25 are collectively irradiated with laser beams. The multiple rows of joints 26a, 26b, 26c . . . can be irradiated one by one with laser beams by moving the linear spot 19b with respect to the sample, thus permitting high-speed irradiation.

FIG. 20 shows a method of irradiating a joint 26aa at a time by means of a large convergence spot 19ba with a size like that of the joint by observing the section of the joint. FIG. 21 shows a method of irradiating a joint 26aa by scanning a minute dotlike or linear spot 19bb. In FIGS. 20 and 21, the numeral 25a indicates the section of a substrate, the numeral 27a the section of a lead of a part 27, and the numeral 26aa the section of a solder joint. As shown in FIG. 20, the whole joint can be collectively irradiated when the convergence spot 19ba is large.

FIGS. 22 to 25 show changes in the temperature of a joint with the temperature as ordinate and time as abscissa in various processes of treatment by laser irradiation.

Figure 22:
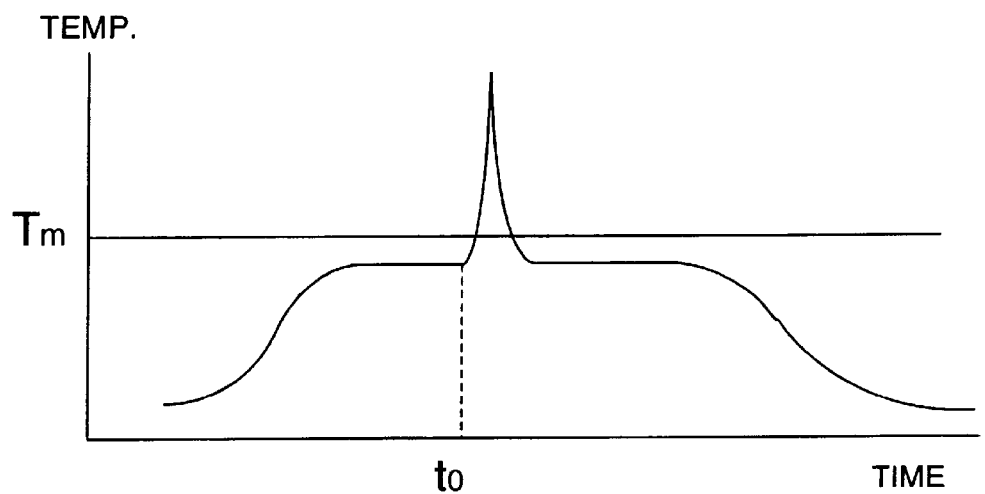
FIG. 22 shows an example of a first temperature profile of a joint portion in which after preheating to a temperature several degrees lower than the melting point, the joint is melted and solidified in a short time by beam irradiation.

FIG. 22 shows a process which involves heating a sample by an ordinary heating furnace, holding the temperature of the sample at a temperature several degrees lower than the melting temperature Tm of solder (for example, preheating at a temperature 5 degrees lower), and irradiating the sample with laser beams at a time t0 to heat it to above the melting point Tm at a stroke. In this case, the laser pulse width is not less than 1 ms. The temperature of a joint portion irradiated with laser pulses exceeds the melting points while other portions are little heated. Therefore, after the irradiation with laser pulses rapid cooling occurs due to the thermal diffusion to the surrounding and the temperature returns to below the melting point Tm. After that, slow cooling is performed in an ordinary furnace.

Figure 23:
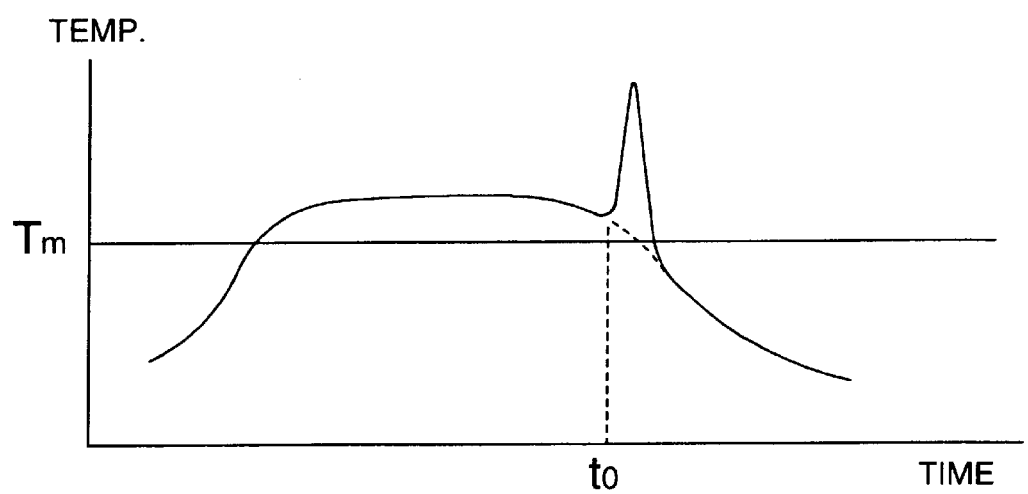
FIG. 23 shows an example of a second temperature profile of a joint portion in which the joint is bonded by heating to above the melting point and the rapid cooling process is given by beam irradiation in the cooling process.

FIG. 23 shows a process which involves raising the temperature of a substrate by an ordinary heating method, holding it at a temperature higher than the melting point Tm of solder, irradiating the substrate with laser pulses immediately before the temperature decreases to below the melting point during cooling, and lowering the temperature to below Tm during rapid cooling.

Figure 24:
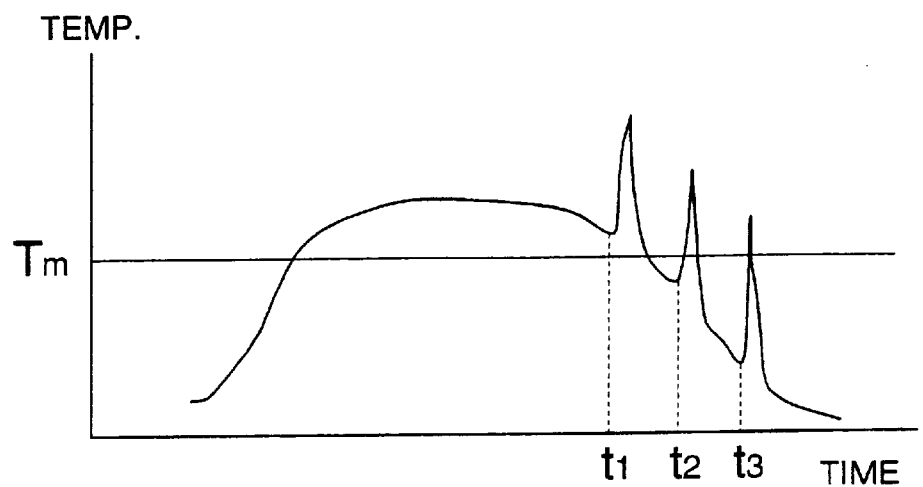
FIG. 24 shows an example of a third temperature profile of a joint portion in which the multi-stage melting and cooling process by multiple-pulse irradiation.

FIG. 24 shows a profile similar to that of FIG. 23. In this process, rapid heating and rapid cooling are repeated by performing the irradiation with laser pulses several times in succession.

Figure 25:
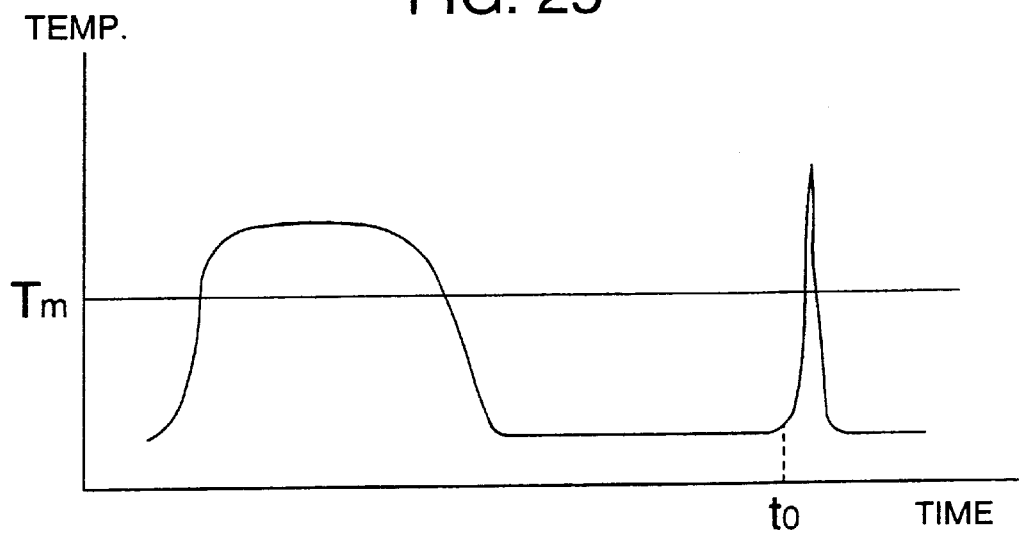
FIG. 25 shows an example of a fourth temperature profile of a joint portion in which after bonding by ordinary soldering, the heating-remelting-resolidification process is adopted.

FIG. 25 shows a process which involves performing solder joining by heating by an ordinary heating method and cooling, then performing slow cooling, and then performing rapid heating to above the melting point Tm by laser irradiation followed by rapid cooling.

A decrease in strength and peeling-off of bonding portions of low-melting lead-free Sn—Ag—Bi alloy solders could be prevented by eliminating the segregation of Bi with the aid of profiles as shown in FIGS. 22 to 25.

In the above embodiments, methods of soldering were described. However, laser beams can be similarly used in repairing solder joints that provide imperfections in bonding portions because of the lift-off ascribed to the segregation of Bi, etc. In this case, segregation can be eliminated, as shown in FIG. 22, by keeping the temperature of the whole substrate lower than the melting point Tm, heating the portion of a joint to be repaired to above the melting point Tm by irradiation of only this portion with laser beams, and then performing rapid cooling. The surrounding solder joints that are not irradiated with laser beams are not affected at all.

In the above embodiments, apparatuses and processes in which laser beams are used were described. It is needless to say, however, that the same principle can be applied to the use of electromagnetic waves such as infrared rays and microwaves.

According to the present invention, there is provided a method of manufacturing an electronic circuit board having few imperfections in bonding portions by improving the reliability of bonding between electronic component and the circuit board made with the use of a lead-free solder containing Bi. There is also provided a method of manufacturing an electronic circuit board having few imperfections in bonding portions by improving the reliability of bonding, which is accomplished especially by optimizing the temperature profile during solder-bonding.

Furthermore, according to the present invention it is possible to make repairs without having adverse effects, such as deterioration of strength and exfoliation, on the surrounding bonding portions (which do not require repairs) during repairing.

What is claimed is:

1. A method of manufacturing an electric circuit board, the method comprising the steps of;
    bonding electronic components to the circuit board with a lead-free solder;
    cooling the bonded structure from a temperature close to the liquidus temperature to a temperature close to the solidus temperature of the lead-free solder at a first cooling rate of from about 10 to 20° C./second; and
    cooling the bonded structure from the temperature close to the solidus temperature of the lead-free solder at a second cooling rate lower than the first cooling rate.

2. A method of manufacturing an electric circuit board according to claim 1, wherein said second cooling rate is from 0.1 to 5° C./second.

3. A method of manufacturing an electronic circuit board according to claim 2, wherein said cooling is performed with a cooling medium selected from a group consisting of air, inert gas, spray liquid, steam, liquid, liquid nitrogen and dry ice, having a temperature that is not higher than room temperature.

4. A method of manufacturing an electronic circuit board according to claim 2, wherein said cooling is performed by any one of spraying and showering a flux cleaning agent including Fluorinert liquid, having a temperature that is not higher than room temperature.

5. A method of manufacturing an electronic circuit board according to claim 1, wherein said cooling is performed by irradiating with a pulsed beam.

6. A method of manufacturing an electronic circuit board according to claim 2, wherein said cooling is performed by irradiating with a pulsed beam.

7. A method of manufacturing an electronic circuit board according to claim 1, wherein said cooling is performed with a cooling medium selected from a group consisting of air, inert gas, spray liquid, steam, liquid, liquid nitrogen and dry ice, having a temperature that is not higher than room temperature.

8. A method of manufacturing an electronic circuit board according to claim 1, wherein said cooling is performed by any one of spraying and showering a flux cleaning agent including Fluorinert liquid, having a temperature that is not higher than room temperature.

9. A method of manufacturing an electric circuit board, the method comprising the steps of:

bonding electronic components to the circuit board with a lead-free solder; and cooling the bonded structure from the temperature close to the solidus temperature of the lead-free solder at a cooling rate of from 0.1 to less than 5° C./second.

10. A method of manufacturing an electronic circuit board according to claim 9, wherein said cooling is performed with a cooling medium selected from a group consisting of air, inert gas, spray liquid, steam, liquid, liquid nitrogen and dry ice, having a temperature that is not higher than room temperature.

11. A method of manufacturing an electronic circuit board according to claim 9, wherein said inert gas is a mixture containing any one of liquid nitrogen and dry ice.

12. A method of manufacturing an electronic circuit board according to claim 9, wherein said cooling is performed by any one of spraying and showering a flux cleaning agent including Fluorinert liquid, having a temperature that is not higher than room temperature.

13. A method of manufacturing an electronic circuit board according to claim 5, wherein said cooling is performed by irradiating with a pulsed beam.

14. A method of manufacturing an electronic circuit board according to claim 13, wherein said pulsed beam is laser light.

15. A method of manufacturing an electronic circuit board according to claim 14, wherein a linear convergence pattern is obtained by means of a cylindrical lens in converging said laser light and a plurality of linear solder joints are irradiated with said laser light.

16. A method of manufacturing an electronic circuit board according to claim 13, wherein said pulsed beam is infrared ray.

17. A method of manufacturing an electronic circuit board according to claim 13, wherein said pulsed beam is microwave.

18. A method of manufacturing an electric circuit board according to claim 13, wherein the solder is kept at a temperature below and close to the melting point of the solder, the solder is irradiated with said pulsed beam so as to be heated to above the melting point, and the temperature of the solder is returned to on or below said melting point by said cooling.

19. A method of manufacturing an electric circuit board according to claim 13, wherein the solder is heated to a temperature above the melting point of the solder, and the solder is irradiated with said pulsed beams after the temperature of the solder returns to a temperature below said melting point.

20. A method of manufacturing an electric circuit board according to claim 13, wherein, after the solder is cooled to a temperature close to room temperature, the solder is irradiated with said pulsed beam to cause the solder to be remelted and resolidify.

21. A method of manufacturing an electronic circuit board according to claim 13, wherein irradiation with a plurality of pulses of said pulsed beam are provided to the solder.

* * * * *